(12) United States Patent
Laidig et al.

(10) Patent No.: US 6,670,081 B2
(45) Date of Patent: Dec. 30, 2003

(54) OPTICAL PROXIMITY CORRECTION METHOD UTILIZING SERIFS HAVING VARIABLE DIMENSIONS

(75) Inventors: Thomas Laidig, Point Richmond, CA (US); Kurt E. Wampler, Sunnyvale, CA (US)

(73) Assignee: ASML Masktools Netherlands B.V., Veldhoven (NL)

( * ) Notice: Subject to any disclaimer, the term of this patent is extended or adjusted under 35 U.S.C. 154(b) by 0 days.

(21) Appl. No.: 09/877,231

(22) Filed: Jun. 11, 2001

(65) Prior Publication Data

US 2002/0028393 A1 Mar. 7, 2002

Related U.S. Application Data

(63) Continuation-in-part of application No. 09/592,653, filed on Jun. 13, 2000.

(51) Int. Cl.⁷ .................................................. G03F 9/00
(52) U.S. Cl. ........................................................ 430/5
(58) Field of Search ............................ 430/5, 322, 311, 430/296; 716/19, 21

(56) References Cited

U.S. PATENT DOCUMENTS

| | | | |
|---|---|---|---|
| 5,229,255 A | 7/1993 | White | 430/311 |
| 5,242,770 A | 9/1993 | Chen et al. | 430/5 |
| 5,256,505 A | 10/1993 | Chen et aql. | 430/5 |
| 5,288,569 A | 2/1994 | Lin | 430/5 |
| 5,324,600 A | 6/1994 | Jinbo et al. | 430/5 |
| 5,362,584 A | 11/1994 | Brock et al. | 430/5 |
| 5,424,154 A | 6/1995 | Borodovsky | 430/5 |
| 5,436,095 A | 7/1995 | Mizuno et al. | 430/5 |
| 5,447,810 A | 9/1995 | Chen et al. | 430/5 |
| 5,538,815 A | 7/1996 | Oi et al. | 430/5 |
| 5,663,893 A | 9/1997 | Wampler et al. | 364/491 |
| 5,707,765 A | 1/1998 | Chen | 430/5 |
| 5,723,233 A | 3/1998 | Garza et al. | 430/5 |
| 5,821,014 A | 10/1998 | Chen et al. | 430/5 |
| 5,827,623 A | 10/1998 | Ishida et al. | 430/5 |
| 5,867,253 A | 2/1999 | Nakae | 355/52 |
| 5,958,635 A | 9/1999 | Reich et al. | 430/30 |
| 6,044,007 A | 3/2000 | Capodieci | 365/120 |
| 6,114,071 A | 9/2000 | Chen et al. | 430/5 |
| 6,174,633 B1 | 1/2001 | Tounai | 430/30 |
| 6,280,887 B1 | 8/2001 | Lu | 430/5 |

FOREIGN PATENT DOCUMENTS

| | | |
|---|---|---|
| JP | 2000-91436 | 3/2000 |
| JP | 2000-147744 | 5/2000 |

*Primary Examiner*—S. Rosasco
(74) *Attorney, Agent, or Firm*—McDermott, Will & Emery

(57) ABSTRACT

A method of forming a mask for optically transferring a lithographic pattern onto a substrate by use of an optical exposure tool, where the pattern comprises a plurality of features each of which has corresponding edges and vertices. The method includes the steps of forming a serif on a plurality of the vertices contained in the lithographic pattern, where each of the serifs has a rectangular shape, and determining the size of each serif independently on the basis of the length of the feature edges touching a given vertex, and the horizontal and vertical distance of the given vertex to the nearest feature edge, wherein the position of each side of a given serif is independently adjustable relative to the length of the remaining sides of the given serif.

13 Claims, 6 Drawing Sheets

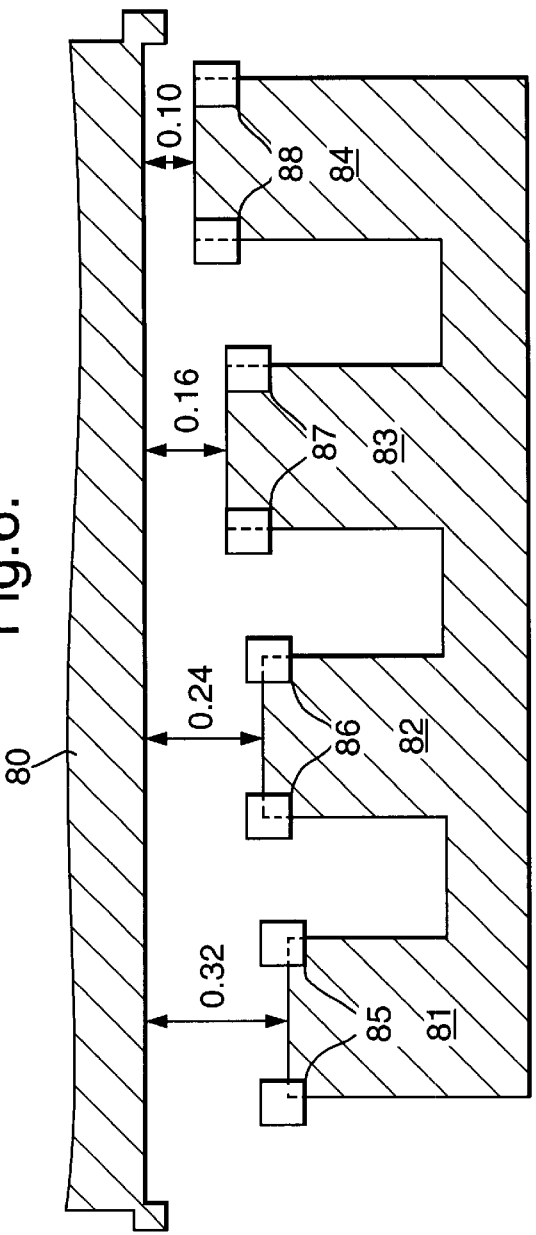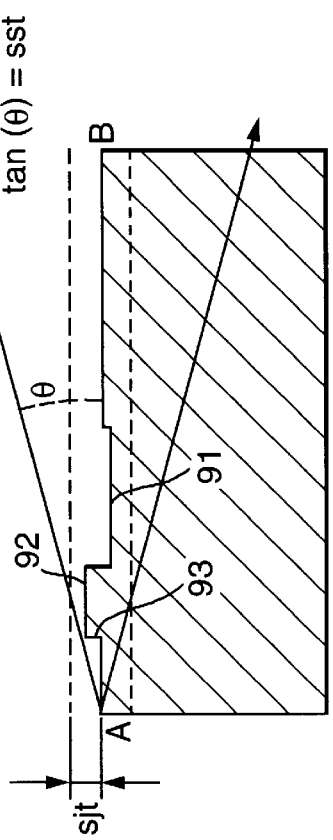

OPTICAL PROXIMITY CORRECTION METHOD UTILIZING SERIFS HAVING VARIABLE DIMENSIONS

This application is a continuation in part of application Ser. No. 09/592,653 filed on Jun. 13, 2000.

FIELD OF THE INVENTION

The present invention relates to photolithography, and in particular relates to optical proximity correction methods utilizing serifs, which are variable in size and position, based on the location of the particular serif relative to the surrounding features.

In addition, the present invention relates to a device manufacturing method using a lithographic apparatus comprising:

- a radiation system for providing a projection beam of radiation;
- a mask table for holding a mask, serving to pattern the projection beam;
- a substrate table for holding a substrate;
- a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

These design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

As the critical dimensions of the circuit layout become smaller and approach the resolution value of the exposure tool, the correspondence between the mask pattern and the actual circuit pattern developed on the photoresist layer can be significantly reduced. The degree and amount of differences in the mask and actual circuit patterns depends on the proximity of the circuit features to one another.

Accordingly, pattern transference problems are referred to as "proximity effects." Proximity effects occur when very closely spaced circuit pattern features are lithographically transferred to a resist layer on a wafer. The light waves of the closely spaced circuit features interact, thereby distorting the final transferred pattern features.

Another common proximity effect problem caused by approaching the resolution limit of the exposure tool is that the corners of the photoresist (both concave and convex) tend to overexpose or underexpose due to a concentration or lack of energy at each of the corners. For example, during exposure to light or radiation the photoresist layer integrates energy contributions from all surrounding areas. Thus, the exposure dose in one vicinity of the wafer is affected by the exposure dose in neighboring vicinities.

Because a corner region in a mask pattern lacks neighboring regions, the exposure dose to a corner of the photoresist layer will always be less than the exposure dose to the main body of the layer. The corners of the developed photoresist pattern, therefore, tend to be rounded, rather than angular, due to the fact that less energy has been delivered to the corners than to the other areas of the masked pattern. In small, dense integrated circuits, such as VLSI circuits, these rounding effects can cause a significant degradation to the circuit's performance. Moreover, rounding results in a loss of contact surface area, which correspondingly reduces the total area available for conduction and accordingly results in an undesirable increase in contact resistance.

To help overcome the significant problem of proximity effects, a number of techniques are used to add sub-lithographic features to mask patterns. Sub-lithographic features have dimensions less than the resolution of the exposure tool, and therefore do not transfer to the photoresist layer. Instead, sub-lithographic features interact with the original mask pattern and compensate for proximity effects, thereby improving the final transferred circuit pattern.

Examples of such sub-lithographic features are scattering bars and anti-scattering bars, such as disclosed in U.S. Pat. No. 5,821,014 (incorporated herein by reference), which are added to mask patterns to reduce differences between features within a mask pattern caused by proximity effects. Another technique used to improve circuit pattern transference from design to wafer is to add features to the mask pattern called "serifs", such as disclosed in U.S. Pat. No. 5,707,765 (incorporated herein by reference). Serifs are typically sub-lithographic square-shaped features positioned on each corner of a circuit feature. The serifs serve to "sharpen" the corners in the final transferred design on the wafer, thereby improving the correspondence between the actual circuit design and the final transferred circuit pattern on the photoresist layer. Serifs are also used at the intersection areas of differing circuit patterns in order to compensate for the distortion factor caused by the intersection of two different circuit patterns.

In particular, it is known to include "positive" serifs at convex vertices so as to adjust the exposure energy of the mask at the vertex to prevent loss of the corner, and to include "negative" serifs at concave vertices. The "negative" serifs essentially remove a portion of the mask pattern at the concave vertex so as to attempt to maintain an accurate representation of the concave vertex in the final pattern formed on the wafer.

However, prior to the present invention, known methods of applying serifs to feature patterns utilized serifs having a predetermined, non-adjustable size. For example, each positive serif contained in the mask pattern had the same dimension, and similarly, each negative serif contained in the mask pattern had the same dimension. Furthermore, in such known systems, the determination of whether or not a serif would be provided in a specific location was determined based solely on the distance of the serif to the next closest serif. In other words, if there was sufficient room to accommodate the predetermined, singular size serif without causing interference (i.e. bridging) with the closest adjacent serif, the serif would be included in the mask design. However, if inclusion of the serif would result in interference with another serif, both serifs were simply cancelled from the pattern, resulting in an undesirable degradation in the final mask pattern and subsequent feature printing.

Such known methods typically defined a minimum allowable distance between a serif and the adjacent serif. As stated, if two serifs were separated by less than the minimum allowable distance, the serifs simply cancelled one another (i.e. both serifs were omitted).

While such known methods of placing serifs are acceptable when the minimum distance between features is sufficiently large, as today's photolithography techniques are continually reducing the minimum distance required between features, the foregoing known method can result in an unacceptable elimination of a significant number of serifs, which correspondingly results in an undesirable reduction in the accuracy of the reproduction of the desired circuit on the wafer.

For example, in the case of a line end having two convex vertices, it is necessary to place positive serifs on each vertex so as to prevent undesirable shortening of the line formed on the wafer. However, due to ever decreasing line widths, in the foregoing serif placement method, the serifs on the two vertices would simply cancel each other because the serifs would be too close to one another. As stated, this results in an undesirable line shortening in the final pattern.

In addition, known serif placement methods do not provide a mechanism for determining whether or not a serif would result in interference with an adjacent feature. This is due to the fact that the CD for typical circuits would readily allow for placement of the serif without any resulting interference. However, as the CD of circuit designs is continually decreasing, it is increasingly likely that positive serifs may interfere with adjacent features.

Accordingly, there exists a need for a method of performing optical proximity correction utilizing serifs that allows for the flexible design of serifs, such that serifs located proximate one another that fail to satisfy a minimum distance requirement are not simply cancelled from the mask pattern. In addition, there is a need for an optical proximity correction method that verifies and prevents interference between serifs and adjacent features.

SUMMARY OF THE INVENTION

In an effort to solve the aforementioned needs, it is an object of the present invention to provide an optical proximity correction method utilizing serifs that allows for the modification of the dimension of each serif, as well as the position of each serif, on an individual basis so as to allow adjacent serifs that initially fail to satisfy a minimum distance requirement to be modified in size and/or position so as to meet the minimum distance requirement.

It is also an object of the present invention to provide an optical proximity correction method that verifies and prevents interference between serifs and adjacent features.

More specifically, in a first embodiment, the present invention relates to a method of forming a mask for transferring a lithographic pattern onto a substrate by use of a lithographic exposure apparatus (tool), where the pattern comprises a plurality of features each of which has corresponding edges and vertices. The method comprises the steps of forming serifs on a plurality of the vertices contained in the lithographic pattern, where each of the serifs has a (substantially) rectangular shape, and determining the size of each serif independently on the basis of the lengths of the feature edges forming a given vertex, and the "horizontal" and "vertical" distance of the given vertex to the nearest feature edge, wherein the position of each side of a given serif is independently adjustable relative to the position of the remaining sides of the given serif. As here employed, the terms "horizontal" and "vertical" refer to mutually orthogonal directions that lie within the plane of the mask pattern; conventionally, they correspond to the X and Y axes parallel to which the edges of most (if not all) of the mask features extend.

In a second embodiment, the present invention relates to a method of forming a mask for transferring a lithographic pattern onto a substrate by use of a lithographic exposure apparatus, where the pattern comprises a plurality of features each of which has corresponding edges and vertices. The method comprises the steps of forming a serif on at least one of the vertices contained in the lithographic pattern, and determining the size of the serif on the basis of at least the length of the feature edges forming said one of the vertices, where the length of each of the feature edges is determined by measuring the distance from said one of the vertices to the closest feature edge that exceeds either a predefined jog tolerance or a predefined slope tolerance.

In a third embodiment, the present invention relates to a method of forming a mask for transferring a lithographic pattern onto a substrate by use of a lithographic exposure apparatus, where the pattern comprises a plurality of line end features, each of which has two vertices and a feature edge. The method comprises the steps of forming a serif on each of the vertices contained in a given line end feature, determining the length of the feature edge, and adjusting the size of each serif formed on the vertices of the given line end feature such that the serifs contact each other so as to form one contiguous surface when the length of the feature edge is less than a predetermined size.

As described in further detail below, the present invention provides significant advantages over the prior art. Most importantly, the optical proximity method of the present invention provides for individual and flexible control of each serif so as to allow the size and position of each serif to be adjustable. As such, it is possible to modify the dimensions of serifs during the mask design process so that serifs that would otherwise be eliminated from the design satisfy minimum distance requirements. As a result, the present invention minimizes the elimination of serifs from the mask design, and the corresponding degradation in the pattern formed on the wafer.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array. An example of such a construction is given in U.S. Pat. No. 5,229,872, which is incorporated herein by reference.

Additional advantages of the present invention will become apparent to those skilled in the art from the following detailed description of exemplary embodiments of the present invention.

The invention itself, together with further objects and advantages, can be better understood by reference to the following detailed description and the accompanying schematic drawings.

BRIEF DESCRIPTION OF THE DRAWINGS

FIG. 6 illustrates an example of how serifs are repositioned in accordance with an exemplary adjustment rule in accordance with the present invention.

FIG. 7 illustrates an example of how the present invention can be utilized to prevent serif loss on vertices near small jogs in feature edges.

In the Figures, like reference symbols indicate like parts.

DETAILED DESCRIPTION OF THE INVENTION

In accordance with the optical proximity correction method of the present invention, each edge of a given serif (both positive and negative) is adjustable relative to every other edge of the given serif so as to allow the overall dimension and the position of the serif to be modified. In addition, each serif can be modified independently of every other serif. The modification of serifs is governed by predefined rules, which are selected/defined by the user in accordance with the feature pattern to be generated. Of course, such rules would vary in accordance with different circuit design features; for example, minimum allowable CD. It is noted that the method of the present invention is typically embodied/incorporated into a program executable on a CAD/EDA system utilized to generate the desired mask pattern.

Figure 1:
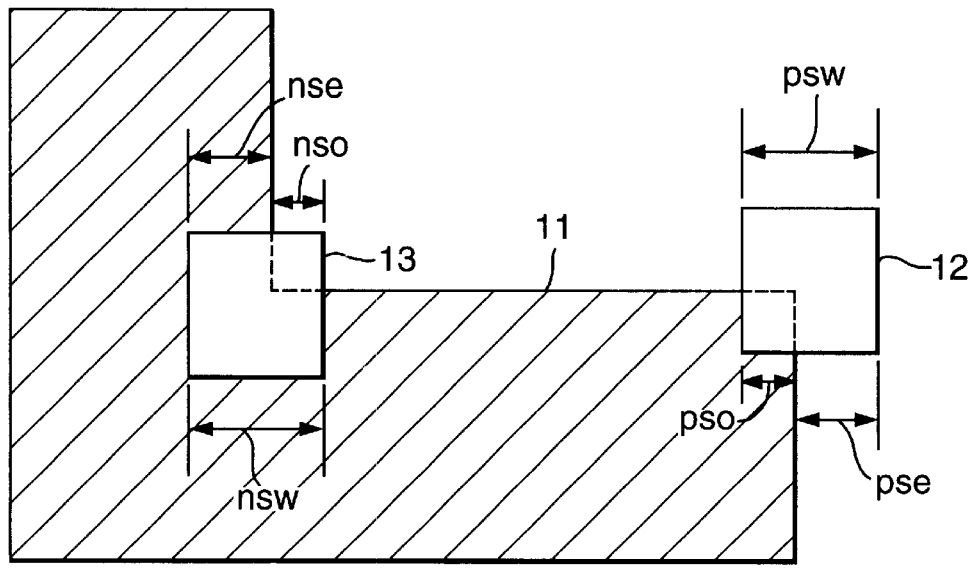
FIG. 1 illustrates an exemplary feature having both a positive serif and a negative serif disposed thereon.

FIG. 1 illustrates both a positive serif 12 formed on a convex vertex and a negative serif 13 formed on a concave vertex. In accordance with the present invention, initially each positive and negative serif 12, 13 is defined as a nominal square serif. As shown, the positive serif 12 is defined by an overall width psw, an overlap pso and an extension pse. As is clear from the figure, pso corresponds to the portion of the positive serif 12 extending over the mask feature 11, pse corresponds to the portion of the positive serif 12 extending beyond the mask feature 11, and psw=pso+pse. With regard to the negative serif 13, nso corresponds to the portion of the negative serif 13 not extending over the mask feature 11, nse corresponds to the portion of the negative serif 13 extending over the mask feature 11, and nsw=nso+nse. In the current embodiment, the default values of both positive and negative serifs are rotationally symmetric. In other words, if one of the serifs were rotated by 90 degrees, the overlap and extension values of the serif would remain the same.

It is noted that it is permissible to define the nominal (or default) dimensions of both positive and negative serifs differently from one another. In addition, while the initial shapes of both positive and negative serifs are shown as squares, it is permissible to utilize a different shape or size for the default value of the serifs.

Figure 2A:
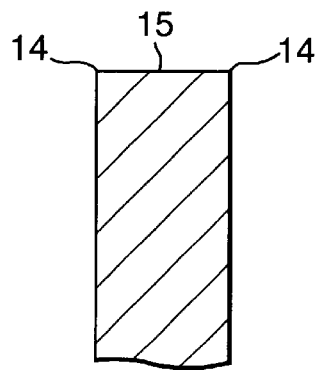
FIG. 2a illustrates a U-edge as defined by the present invention.
Figure 2B:
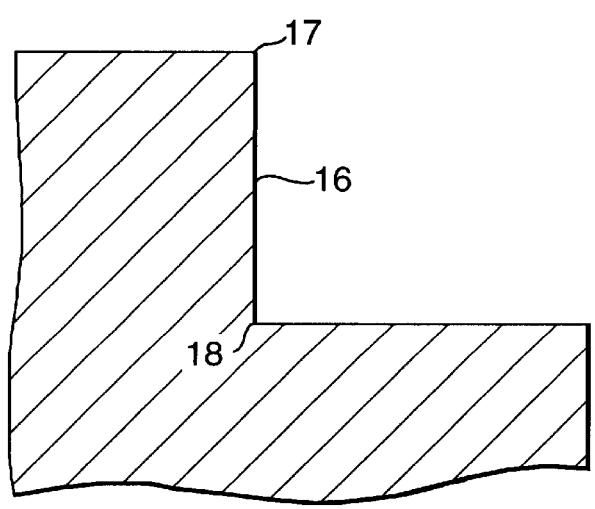
FIG. 2b illustrates an S-edge as defined by the present invention.

The method of the present invention also classifies the edges forming a vertex on which a serif is to be placed into one of two categories. Specifically, each edge forming a vertex is classified as either a "U-edge" or an "S-edge". FIG. 2a illustrates an example of a U-edge. As shown, the U-edge 15 has a convex vertex 14 formed on each end thereof. A common U-edge is a line end. Similarly, an edge that has concave vertices on both ends is also a U-edge. FIG. 2b illustrates an S-edge 16. As shown, the S-edge 16 has a convex vertex 17 on one end and a concave vertex 18 on the other end. It is noted that an S-edge represents what is referred to as a "jog" (i.e. step). Specifically, referring to FIG. 2b, the length of the S-edge represents the depth of the jog. In some instances, as explained in detail below, if the depth of the jog is below a predefined minimum, the S-edge is ignored and the edges connected to the S-edge are treated as a single continuous edge.

As indicated above, in the method of the present invention, the size and position of each serif are affected by the surrounding/adjacent features contained in the mask pattern. Accordingly, it is necessary to determine the surrounding features when placing and sizing a serif for a given vertex. In the current embodiment, each serif generated for a given vertex can be influenced by up to four independent variables. Specifically, the four variables are: 1) the length of the first edge touching the vertex (i.e. either a U or S-edge), 2) the length of the second edge touching the vertex, 3) the "horizontal" distance from the vertex to the nearest feature edge and 4) the "vertical" distance from the vertex to the nearest feature edge (using the earlier definition of the terms "horizontal" and "vertical"). The results of the four foregoing variables are utilized to determine the size and position of a given serif in accordance with predefined rules, which may vary from design to design.

Figure 3:
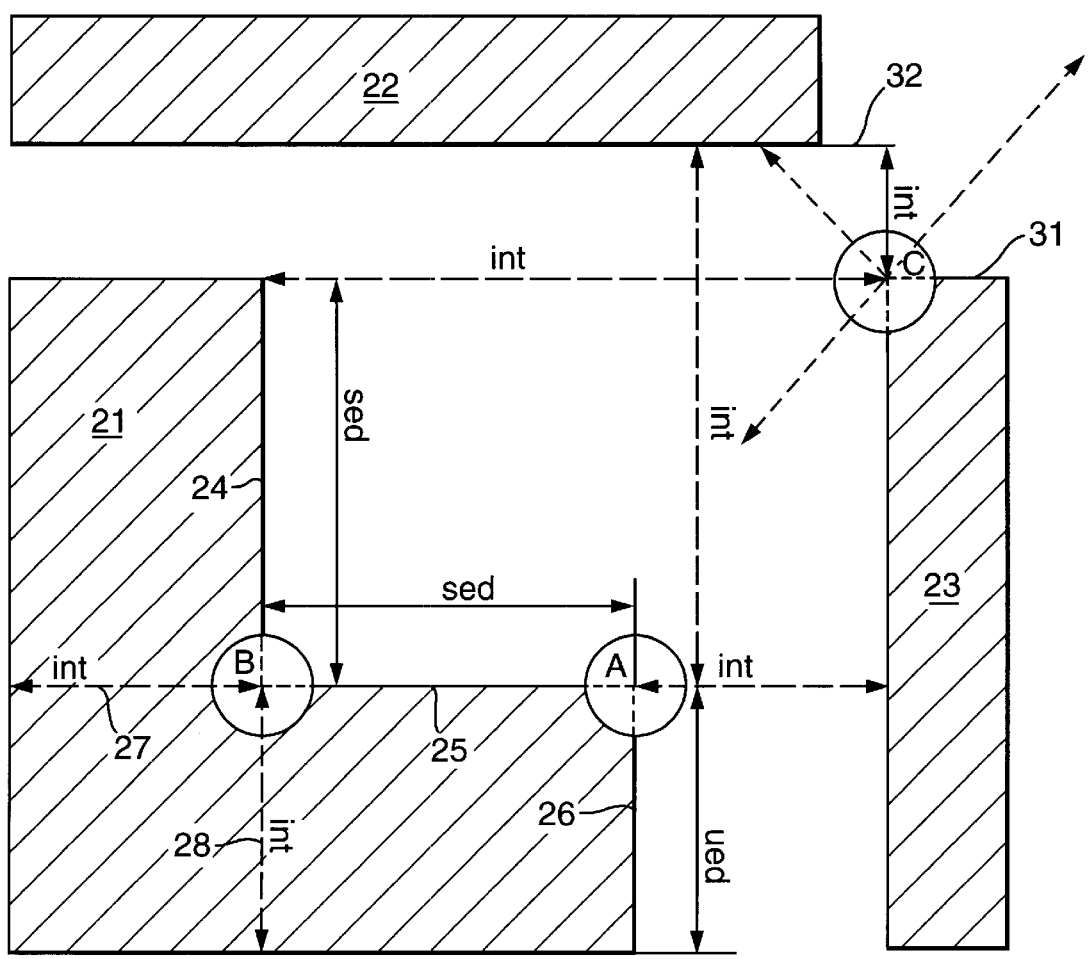
FIG. 3 illustrates how the variables utilized in the determination of the size and position of a serif are computed in accordance with the present invention.

FIG. 3 illustrates how the four variables would be measured for both a convex vertex "A" and a concave vertex "B". Referring to FIG. 3, the portion of the mask pattern disclosed therein contains three features 21, 22 and 23. Feature 21 comprises a first S-edge 24, a second S-edge 25 (both indicated by "sed") and a U-edge 26 (indicated by "ued"). S-edges 24 and 25 are joined at vertex B, while S-edge 25 and U-edge 26 are joined at vertex A. With regard to vertex A, the lengths of the edges touching vertex A comprise the length of edge 25 and the length of edge 26. The "horizontal" distance from vertex A to the nearest feature edge, is the distance to feature 23. The "vertical" distance from vertex A to the nearest feature edge, is the distance to feature 22. With regard to vertex B, the lengths of the edges touching vertex B comprise the length of edge 24 and the length of edge 25. The "horizontal" distance from vertex B to the nearest feature edge, is the distance (represented by line 27) to the outside edge of feature 21. The "vertical" distance from vertex B to the nearest feature edge, is the distance (represented by line 28) to the outside edge of feature 21. As is clear from the foregoing, it is noted that for convex vertices, the intervals (indicated by "int") are measured from the vertex to the nearest adjacent out-facing edge, and for concave vertices, the intervals are measured from the vertex to the nearest "in-facing" edge of the same feature.

Furthermore, when determining interval measurement for a convex vertex, a ±45 degree field of view is considered when searching for an adjacent feature edge. It is noted that in the current embodiment, even in the case where the adjacent feature edge is on a diagonal line to the vertex under consideration, the distance or interval length utilized in the calculation process is defined as the perpendicular distance to the facing edge. Vertex C of FIG. 3 illustrates the foregoing point. Specifically, the vertical distance from vertex C to feature 22 is the perpendicular distance from U-edge 31 to the line defined by the bottom edge of feature 22, as represented by line 32.

In accordance with the present invention, each of the four edges of any given serif may be adjusted in response to any of the four independent measurements (i.e. variables) noted above and illustrated in FIG. 3. The amount that a particular serif edge moves away from the default value of the serif is the sum of the components specified in the predetermined rules relating to the particular design and process being utilized. Examples of how serif edges may be adjusted are set forth below. It is noted however, that the present invention is not limited to the specific examples shown. Indeed, when or how to adjust a given serif will depend on numerous factors, many of which are design and process dependent, and as such, would vary from application to application.

Figure 4:
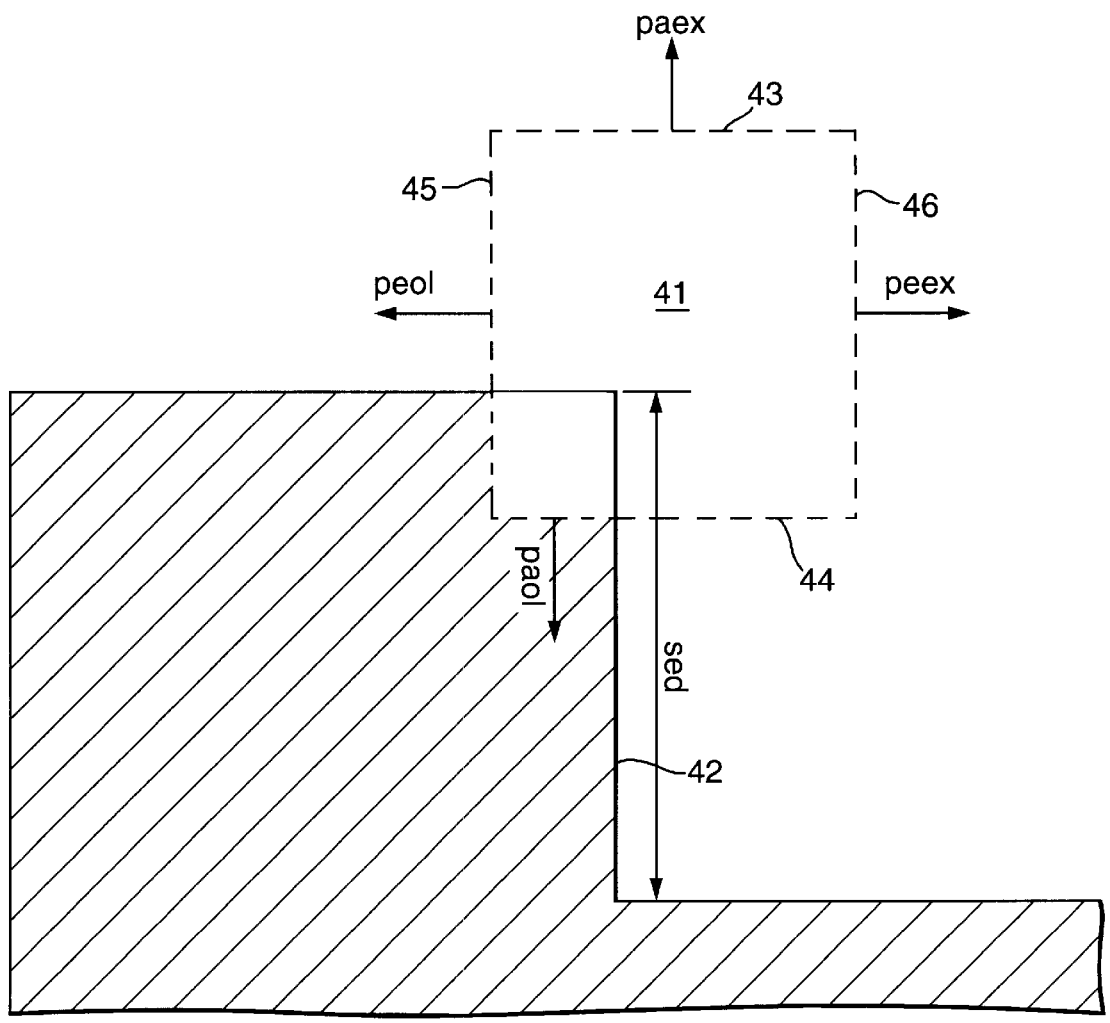
FIG. 4 illustrates the adjustment vectors for manipulating the size and position of the serifs according to the present invention.

FIG. 4 illustrates how a positive serif 41 can be adjusted in accordance with the present invention. While not shown, negative serifs are adjustable in a similar manner. Referring to FIG. 4, as stated above each of the four edges of a serif may be adjusted independently of the other edges. In the current embodiment, the present invention utilizes four adjustment vectors, each of which corresponds to a given edge of the serif, to designate how a particular edge should be moved relative to the default dimensions of the serif. In FIG. 4, the four adjustment vectors are diagrammed relative to the length of the S-edge 42. As shown, the four adjustment vectors are designated: 1) paex, 2) peex, 3) paol and 4) peol. The vector paex corresponds to the distance the upper edge 43 of the serif 41 extends from its default value position, whereas paol corresponds to the distance the bottom edge 44 of the serif 41 extends from its default position. Similarly, peol corresponds to the distance the left-side edge 45 of the serif 41 extends from its default position, and peex corresponds to the distance the right-side edge 46 of the serif 41 extends from its default position. Although not shown in FIG. 4, it is noted that negative values for any of the four adjustment vectors indicate a decrease in serif size from the default value. It is further noted that while positive values have been utilized to indicate an increase in serif size, and negative values a decrease, clearly the opposite is also possible.

Accordingly, assuming a positive value for paex, and default values for the remaining three adjustment vectors, the result would be a serif having an increased size and a rectangular, but non-square shape.

As a result of defining individual vectors for each edge of each given serif to be included in the mask pattern, the present invention allows for individual control of the size and placement of each serif. For example, referring to FIG. 4., assuming an adjacent feature (not shown) was positioned too closely to the top edge 43 of serif 41 such that the minimum spacing rule was violated, it is possible to retract the top edge 43 of serif 41, by applying the appropriate negative value of paex, thereby reducing the size of the serif, such that the minimum spacing rule is no longer violated. Alternatively, it is also possible to retract the entire serif 41 from the feature until the minimum spacing rule is satisfied. This solution allows a serif of the same size to be utilized, with the serif shifted in position. Of course, other variations are also possible. The important aspect is that the serif is not eliminated from the mask pattern, and as a result, degradation of the pattern subsequently printed utilizing the mask is prevented.

It is noted that the user defines the rules regarding how and when serif dimensions should be modified in response to data obtained regarding the four independent variables noted above. The rules are then typically stored in the CAD/EDA system utilized to generate the mask pattern. When a given rule is applicable, the CAD/EDA system automatically adjusts the size of the given serif in accordance with the given rule. Examples of such rules are set forth below.

Table I set forth below lists exemplary base parameters related to the computation and adjustment of serif size and dimension. Referring to Table I, most of the base parameters have been discussed above. It is noted that the term "nominal" is utilized to designate the default dimensions of the serif. As stated above, the default dimensions are predetermined, and can be varied from application to application.

TABLE I

| Parameter | Comments |
|---|---|
| serif_style = flexible | Adjustable serifs/hammerheads |
| serif_width | Nominal size of positive and negative serifs |
| psw (ps_width) | Nominal size of positive serifs |
| nsw (ns_width) | Nominal size of negative serifs |
| serif_ext | Nominal serif extension beyond primary figure corners |
| pse (ps_ext) | Nominal positive serif extension |
| nse (ns_ext) | Nominal negative serif extension |

TABLE I-continued

| Parameter | Comments |
|---|---|
| serif_overlap | Nominal serif overlap of primary figure corner |
| pso (ps_overlap) | Nominal positive serif overlap |
| nso (ns_overlap) | Nominal negative serif overlap |
| sjt (serif_jog_tolerance) | Maximum jog in U-edge or S-edge |
| sst (serif_slope_tolerance) | Maximum slope of non-rectilinear edge |
| serif_min_width | Minimum serif width |
| ps_min_width | Minimum positive serif width |
| ns_min_width | Minimum negative serif width |
| serif_adj = {sublist} | Positive and negative serif adjustment rule |
| ps_adj = {sublist) | Positive serif adjustment rule |
| ns_adj = {sublist) | Negative serif adjustment rule |
| do_serifs | Boolean operation: enables serif synthesis |

With regard to the parameters not previously discussed, serif_width, serif_ext and serif_overlap are utilized when the default values for both the positive and negative serifs are equal. It is noted that in the current embodiment, serif_overlap is automatically limited to half the edge length. As explained below, sjt (serif_jog_tolerance) and sst (serif_slope_tolerance) are utilized to define whether or not an S-edge in jog will be treated as a separate edge or ignored. The parameter serif_min_width defines the minimum width of both positive and negative serifs, whereas ps_min_width and ns_min_width define the minimum width of positive and negative serifs, respectively. It is noted that serif_min_width is only utilized if both ps_min$_{13}$ width and ns_min_width are identical. The parameters serif_adj, ps_adj and ns_adj each correspond to a rule statement that acts on a given serif in response to one of the four independent context variables noted above. The command do_serifs corresponds to a switch which enables or disables serif creation; ndo_serifs is utilized to disable.

Table II sets forth sub-option parameters pertaining to the measurements associated with individual serifs and the nearest adjacent feature as discussed above, as well as the extensions lo utilized to adjust the size of the individual serifs. It is noted that each of the sub-option parameters set forth in Table II can be either a single value or a value range. When a range is indicated, the value varies linearly between the two stated extremes. It is noted that when a range of values is specified for a context variable (e.g. sed=(0.1:0.3)), the adjustment response may also be a range (e.g. paol=(−0.2:0)), and linear interpolation can be utilized for intermediate dimensions.

TABLE II

| Parameter | Variable Type | Comments |
|---|---|---|
| ued | Independent | U-edge length |
| sed | Independent | S-edge length |
| int (interval) | Independent | Distance from corner to adjacent figure edge |
| paex | Dependent | Serif extension parallel to edge or interval |
| paol | Dependent | Serif overlap parallel to edge or interval |
| peex | Dependent | Serif extension perpendicular to edge or interval |
| peol | Dependent | Serif overlap perpendicular to edge or interval |

Examples of how the present invention can be utilized to modify serifs are now provided. First, serif cancellation occurs when the adjusted serif size falls below the value of serif_min_width. This can occur, for example, when a side of a serif is retracted in an effort to satisfy the minimum separation requirement between the serif and an adjacent feature, and the width of the serif which satisfies the minimum separation requirement results in a serif having a width less than serif_min_width. In such an instance, the serif is cancelled. A cancellation can also be prescribed in a rule, for example, by specifying an amount of minus infinity for any one of the four serif edge adjustments, which simply reduces the length of the associated edge to zero, thereby eliminating the serif from the mask pattern. It is noted that while one of the goals of the present invention is to prevent or minimize the cancellation of serifs, cancellation of serifs is still possible when necessary to satisfy a given rule defined by the user.

Figure 5:
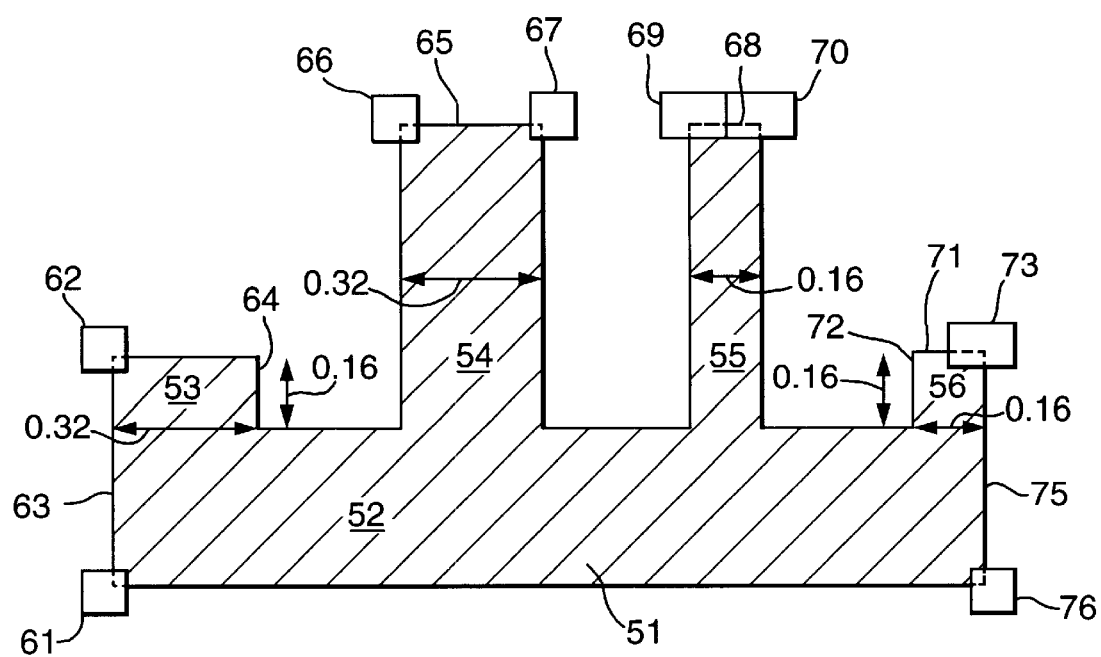
FIG. 5 illustrates an example of how serifs are adjusted in size in accordance with an exemplary adjustment rule in accordance with the present invention.

FIG. 5 illustrates another example of how the present invention can be utilized to adjust serifs disposed on U-edges. As mentioned above, depending on the width of a given line, it is often desirable to form one continuous serif (generally referred to as a "hammer head") on the corresponding line so as to prevent unwanted shortening of the line during fabrication. In the example illustrated in FIG. 5, the applied rules regarding serif adjustment are as follows:

psw=0.10,
pso=0.03,
ps_adj={sed=(0:0.16), paex=−infinity},
ps_adj={ued=(0:0.16), paol=infinity}, and
do_serifs Referring to FIG. 5, there is one feature 51 having a main horizontal portion 52 and four vertical portions 53–56. In accordance with the foregoing rules, first only positive serifs will be applied to convex vertices. The nominal width of each serif will be 0.10 and the nominal overlap of the serif on the mask feature will be 0.03. However, the adjustment rules modify the serifs under the following conditions. Specifically, if the length of an S-edge touching a convex vertex is within the range 0–0.16, the serif is omitted (by making paex equal minus infinity). In addition, if the length of a U-edge touching a convex vertex is within the range 0–0.16, the serif is extended over half of the length of the edge (by making paol equal infinity). It is noted that even though the overlap is designated to be infinity, the current embodiment limits the maximum overlap to ½ the length of the corresponding edge.

Applying the foregoing exemplary rules to the features illustrated in FIG. 5, a first serif 61 and a second serif 62 are placed on the vertices of U-edge 63. In accordance with the rules, each serif 61 and 62 has an overall width of 0.10 and overlap of 0.03. It is noted that U-edge 63 has a length greater than 0.16.

Next, the convex vertex formed by S-edge 64 does not have a serif disposed thereon, because the length of S-edge 64 is only 0.16. As such, paex is set to minus infinity, thereby resulting in the omission of a serif from the convex vertex formed by S-edge 64. It is noted that the foregoing rules do not indicate or command placement of negative serifs; as such, no negative serifs appear in FIG. 5.

Continuing, referring to vertical portion 54 containing U-edge 65 having two convex vertices, similar to serifs 61 and 62, a positive serif 66, 67, each having an overall width of 0.10 and overlap of 0.03, is placed on each vertex. It is noted that the length of U-edge 65 is greater than 0.16.

However, vertical portion 55 has a width of 0.16, and therefore U-edge 68 has a length of 0.16. As such, the ps_adj rule applicable to U-edges is applied. As a result, each serif 69, 70 formed on the convex vertices at the ends of U-edge 68 is formed so as to extend over half of U-edge 68. This results in a continuous serif or hammerhead (formed by two separate serifs) extending over U-edge 68.

It is noted that the formation of a hammerhead serif instead of two distinct corner serifs in such a situation is exceedingly beneficial, because it removes the difficulty of fabricating the small gap between serifs on the mask, while having nearly identical effect during printing.

Referring to vertical portion 56, it is noted that U-edge 71 has a length of 0.16 and S-edge 72 has a length of 0.16. As such, both rules set forth above regarding ps_adj of S-edges and U-edges are applied. Specifically, as S-edge 72 has a length of 0.16, paex is set to equal minus infinity, which results in the omission of a serif on the convex vertex formed by S-edge 72. In addition, as U-edge 71 has a length of 0.16, paol is set to equal infinity, which results in serif 73 extending half the distance of U-edge 71.

Finally, turning to U-edge 75, it is noted that serif 73 is not also extended in the "vertical" direction along U-edge 75 because the length of U-edge 75 exceeds 0.16, and therefor the ps_adj rule is not applicable. Serif 76 is formed on the lower convex vertex of U-edge 75 in the manner similar to serif 61.

FIG. 6 illustrates an example of how the present invention can be utilized to reposition serifs based on the proximity of adjacent features. In the example illustrated in FIG. 6, the applied adjustment rules are as follows:

serifhd —width=0.10,
serif_ext=0.07
serif_adj (a)={int=(0.32:0.16),
    paex=(0:−0.07), paol=(0:0.07)},
serif_adj (b)={int=(0.16:0),
    paex=−0.07, paol=0.07}, and
do_serifs in accordance with the foregoing rules, in the event the "interval" between the vertex on which serif is to be placed and the facing edge of an adjacent feature is between 0.16 and 0.32, the corresponding serif will be shifted in position by decreasing the par_ext by a linearly-interpolated value in the range of 0:−0.07 and increasing the par_olap by a value in the range 0:0.07. Alternatively, in the event the "interval" between the vertex on which the serif is to be placed and the adjacent feature edge is between 0.0 and 0.16, the corresponding serif will be shifted in position by decreasing the par_ext by a value of −0.07 and increasing the par_olap by a value of 0.07 remaining "fully-retracted".

Referring to FIG. 6, applying the foregoing rules to the exemplary features set forth in FIG. 6, feature 81 is separated from feature 80 by 0.32. As such, serif_adj (a) is applicable, and both serifs 85 are retracted by 0.0 in accordance with the rule. It is noted that serif_adj (a) provides a range (i.e. interval) over which the rule is applicable, as well as a range for adjusting the serifs. As the distance of 0.32 is the starting point of application of the rule, and has a corresponding adjustment of 0, serifs 85 are not adjusted. As noted above, when a range/interval is applied, in the present embodiment, linear interpolation is utilized to determine how much the serif should be adjusted. Continuing, feature 82 is separated from feature 80 by 0.24. Once again, serif_adj (a) is applicable, and therefore serifs 86 are retracted approximately 0.035 in accordance with the rule. Feature 83 is separated from feature 80 by 0.16. As such, serif_adj (b) is applicable, and therefore serifs 86 are retracted approximately 0.07, which represents the maximum retraction in the current example. As shown, the upper edges of serifs 87 are substantially flush with the upper edge of feature 87. Finally, feature 84 is separated from feature 80 by 0.10. Once again, serif_adj (b) is applicable, and therefore serifs 88 are retracted approximately 0.07. It is again noted that the foregoing is merely an illustrative example of one possible rule.

FIG. 7 illustrates how the present invention can be utilized to prevent serif loss on vertices near small jogs in feature edges. More specifically, sjt and sst parameters are provided to control how small jogs influence the computed U-edge and S-edge length. Such jogs may arise in the original circuit data, as a result of fine biasing for proximity correction, or as a result of decomposing diagonal feature edges into stair steps.

Referring to FIG. 7, in accordance with the current embodiment, the span from vertex A to vertex B will be treated as a single U-edge provided that all jogs in the edge fall within the predefined jog and slope tolerances. If either tolerance is reduced to overlap one of the jogs, the measured edge length will span from vertex A to the first jog that falls out of bounds with the tolerance. As shown in FIG. 7, referring to vertex A, the length of a given jog is measured by the perpendicular distance from the U-edge 91 touching vertex A to the surface 92, which extends parallel to surface 91, and which is formed as a result of the jog 93. If the length of the jog 93 exceeds the predefined jog_tolerance, then the jog 93 is treated as an actual edge, and is not ignored. Referring again to vertex A, to determine if the sst is violated, it is necessary to measure angle θ and verify that it is less than a predetermined value. As shown in FIG. 7, θ associated with a given vertex (e.g. A) is measured by determining the angle formed by the line intersecting the given vertex, and the upper corner of the nearest jog to A.

It is noted that in accordance with the present embodiment, the edge length corresponding to a given vertex is measured independently for each vertex touching the given edge. Accordingly, based on a given set of jog and slope tolerances, it is possible that the length of A's U-edge 91 might extend to vertex B, but B's U-edge 91 would not extend to vertex A. Parameter sjt is typically set high enough to ignore the maximum jog that could be produced by fine-bias OPC correction (e.g. typical values are 5%–20% of the minimum width CD). In addition, in the current embodiment, edge jog consolidation will stop at the first deviation in the edge's direction that exceeds ±90 degrees, even if it remains positionally within the jog and slope tolerances.

Figure 8:
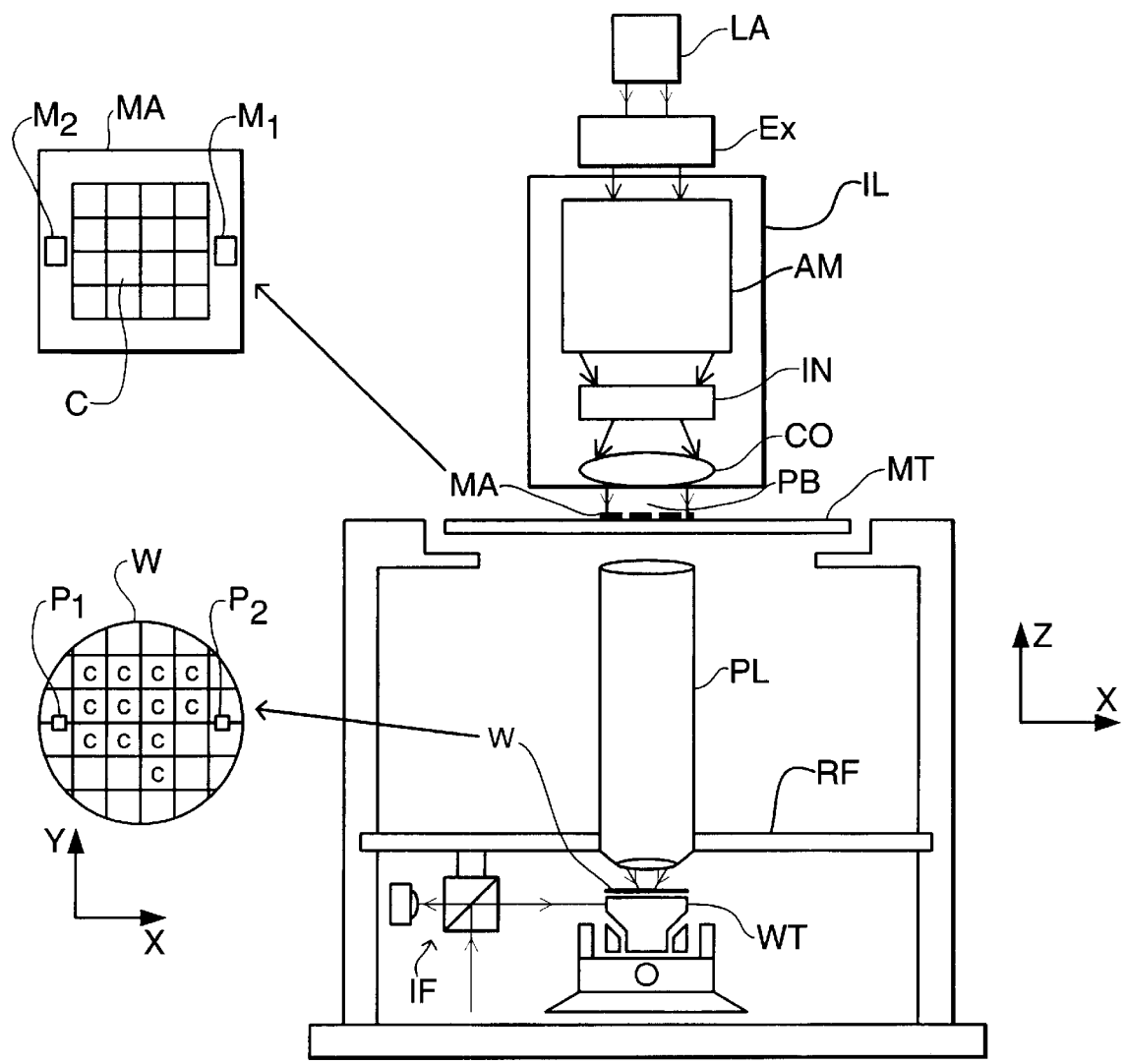
FIG. 8 illustrates a lithographic projection apparatus.

FIG. 8 schematically depicts a lithographic projection apparatus suitable for use with a mask designed with the aid of the current invention. The apparatus comprises:
- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 8 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short stroke actuator, or may be fixed.

The depicted tool can be used in two different modes:
- In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

While specific details of various embodiments of the optical proximity correction method utilizing adjustable serifs have been disclosed herein, it is also clear that other variations are possible. For example, many different rules for resizing or repositioning serifs are possible. Indeed, the specifics of such rules would vary from application to application. Accordingly, it is not intended that the scope of the present invention be limited to the foregoing examples. Clearly, variations of the specific examples disclosed herein, as well as numerous additional rules, are also possible.

As described above, the optical proximity correction method utilizing adjustable serifs of the present invention provides significant advantages over the prior art. Most importantly, the optical proximity method of the present invention provides for individual and flexible control of each serif so as to allow the size and position of each serif to be adjustable. As such, it is possible to modify the dimensions of serifs during the mask design process so that serifs (that would otherwise be eliminated from the design) satisfy minimum distance requirements. As a result, the present invention minimizes the elimination of serifs from the mask design, and the corresponding degradation in the pattern formed on the wafer.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

What is claimed is:

1. A method of forming a mask for transferring a lithographic pattern onto a substrate by use of a lithographic exposure apparatus, said pattern comprising a plurality of features each of which has corresponding edges and vertices, said method comprising the steps of:

forming a serif on a plurality of said vertices contained in said lithographic pattern, each of said serifs having a substantially rectangular shape, and determining the size of each serif independently on the basis of the length of the feature edges forming a given vertex, and a first distance and a second distance from the given vertex to the nearest feature edge, said first distance and said second distance corresponding to a first direction and a second direction, respectively, which are substantially perpendicular to one another and within the plane of the mask pattern, wherein the position of each side of a given serif is independently adjustable relative to the positions of the remaining sides of the given serif.

2. The method of claim 1, further comprising assigning an adjustment vector to each side of said given serif, said adjustment vector defining a variation in the location of a corresponding side of said given serif relative to a default location.

3. The method of claim 1, wherein each side of said serif has a default position which is selected such that each serif initially exhibits a substantially square configuration.

4. The method of claim 1, further comprising the step of defining predetermined rules governing the length of each side of a serif, said predetermined rules utilizing the results of the determination of the length of the feature edges forming a given vertex on which said serif is to be positioned, and the first and second distance of the given vertex to the nearest feature edge.

5. The method of claim 1, wherein said first and said second directions correspond to X and Y axes parallel to which the edges of at least 50% of the mask features extend.

6. The method of claim 1, wherein said vertices comprise convex vertices and concave vertices, and said serifs comprise positive serifs and negative serifs, respectively.

7. The method of claim 1, wherein said pattern comprises a plurality of line end features, each of which has two vertices and a feature edge, said method comprising the steps of:

forming a serif on each of said vertices contained in a given line end feature, determining the length of the feature edge, and adjusting the size of each serif formed on said vertices of said given line end feature such that the serifs contact each other so as to form one contiguous edge when said length of said feature edge is less than a predetermined length.

8. The method of claim 7, wherein the size of each of said serifs is adjusted such that each of said serifs overlaps ½ the length of said feature edge.

9. The method of claim 7, wherein the maximum amount the size of each of said serifs can be adjusted by is equal to ½ the length of said feature edge.

10. The method of claim 1, said method comprising the steps of:

forming a serif on at least one of said vertices, said serif having a rectangular shape, and determining the size of said serif on the basis of at least the length of the feature edges forming said one of said vertices, said length of each of said feature edges being determined by measuring the distance from said one of said vertices to the closest feature edge which exceeds either a predefined jog tolerance or a predefined slope tolerance.

11. The method of claim 1, wherein the adjustments to the length of the sides of a given serif are added together to achieve a total adjustment.

12. A device manufacturing method comprising the steps of:

(a) providing a substrate that is at least partially covered by a layer of radiation-sensitive material;

(b) providing a projection beam of radiation using a radiation system;

(c) using a mask pattern to endow the projection beam with a pattern in its cross-section;

(d) projecting the patterned beam of radiation onto a target portion of the layer of radiation-sensitive material, wherein the mask employed in step (c) is designed using a method according to claim 1.

13. A device manufactured according to the method of claim 12.

* * * * *